(12) United States Patent
Degay et al.

(10) Patent No.: US 9,269,400 B2
(45) Date of Patent: Feb. 23, 2016

(54) APPARATUS FOR LOCKING A COMPONENT DRAWER INTO A CHASSIS

(71) Applicants: Francis Degay, Villejuif (FR); Damien Vauvel, Chatillon (FR); Philippe Pardonnet, Paris (FR)

(72) Inventors: Francis Degay, Villejuif (FR); Damien Vauvel, Chatillon (FR); Philippe Pardonnet, Paris (FR)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/027,443

(22) Filed: Sep. 16, 2013

(65) Prior Publication Data

US 2015/0076982 A1 Mar. 19, 2015

Related U.S. Application Data

(60) Provisional application No. 61/877,963, filed on Sep. 14, 2013.

(51) Int. Cl.
*H03K 5/02* (2006.01)
*G11B 33/00* (2006.01)
*H05K 7/14* (2006.01)

(52) U.S. Cl.
CPC .............. *G11B 33/00* (2013.01); *H05K 7/1405* (2013.01); *H05K 7/1409* (2013.01)

(58) Field of Classification Search
CPC .. B11B 33/022; B11B 33/123; B11B 33/124; H05K 7/1409
See application file for complete search history.

(56) References Cited

U.S. PATENT DOCUMENTS

| | | |
|---|---|---|
| 4,979,909 A | 12/1990 | Andrews |
| 5,557,499 A | 9/1996 | Le et al. |
| 5,765,933 A | 6/1998 | Paul |
| 5,790,373 A | 8/1998 | Fruhauf et al. |
| 5,947,572 A | 9/1999 | Chang |
| 5,963,422 A | 10/1999 | Golobay et al. |
| 6,067,225 A | 5/2000 | Eberhardt et al. |
| 6,272,010 B1 | 8/2001 | Schmitt |
| 6,304,439 B1 | 10/2001 | Anderson |
| 6,378,965 B1 | 4/2002 | Reznikov et al. |
| 6,606,256 B1 * | 8/2003 | Lee et al. ...................... 361/825 |
| 6,683,785 B1 * | 1/2004 | Chen ........................ 361/679.33 |
| 6,952,341 B2 | 10/2005 | Hidaka et al. |
| 7,551,427 B1 | 6/2009 | Blaugrund et al. |
| 2007/0187267 A1 * | 8/2007 | Hong et al. .................... 206/307 |
| 2009/0165255 A1 * | 7/2009 | Liu et al. ......................... 16/422 |
| 2009/0279249 A1 * | 11/2009 | Crippen et al. .......... 361/679.58 |
| 2011/0101831 A1 * | 5/2011 | Wang et al. ................. 312/223.1 |
| 2012/0273638 A1 | 11/2012 | Sun |
| 2013/0130528 A1 * | 5/2013 | Jun et al. ....................... 439/160 |
| 2013/0313955 A1 * | 11/2013 | Kuo ............................... 312/326 |
| 2014/0117829 A1 * | 5/2014 | Lin ............................... 312/350 |

* cited by examiner

*Primary Examiner* — Daniel Rohrhoff

(57) ABSTRACT

Provided herein is an apparatus, including: a component drawer, a chassis including an opening configured to removably receive the component drawer therethrough, a cover for the component drawer, and means for locking the component drawer in the chassis during movement of the component drawer into the chassis with the cover in a storage position, and for releasing the component drawer from the chassis when the cover is the non-storage position.

14 Claims, 6 Drawing Sheets

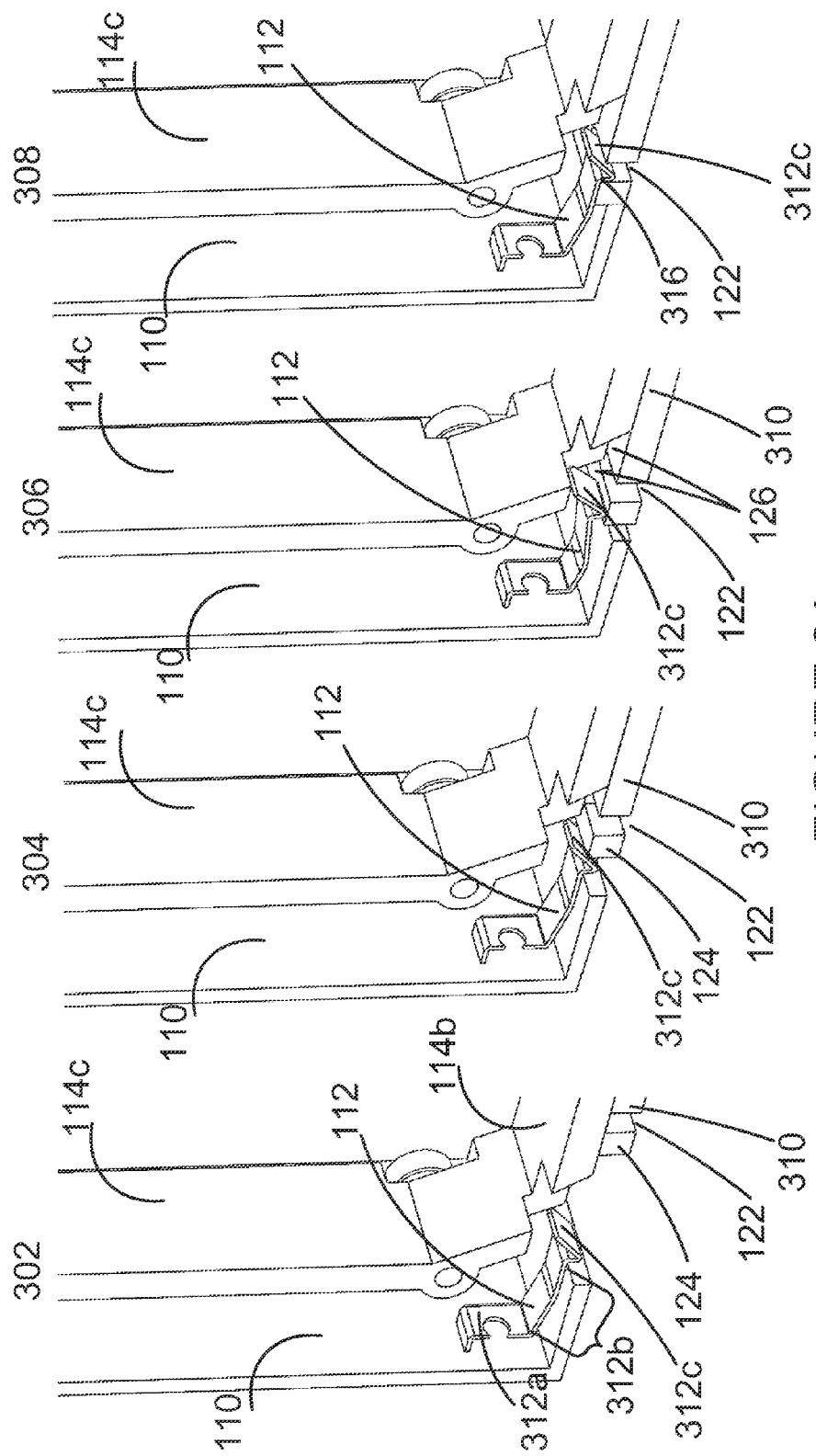

APPARATUS FOR LOCKING A COMPONENT DRAWER INTO A CHASSIS

RELATED APPLICATIONS

This application claims the benefit of U.S. Provisional Patent Application No. 61/877,963, filed Sep. 14, 2013, by Degay et al.

BACKGROUND

Computing systems, including servers, portable and/or desk-top devices, include one or more components. Generally, components are housed in a component drawer and further inserted in a chassis of a computing system. For instance, a hard disk drive may be housed in a hard disk drive drawer and then inserted into hard disk drive bay. In such arrangements, components may be removed, replaced, and/or added in a computing system.

Mechanisms of removal and insertion of a component may use a lever to engage and/or disengage a hook from a chassis. However, using a lever is cumbersome. It is appreciated that in such a lever based system, a component drawer may not be inserted properly unless the lever is in the proper position to move a hook out of the way during insertion. For example, due to improper positioning of the lever, the hook may contact the outside of the chassis, thereby preventing the component drawer from being inserted. Furthermore, it is appreciated that if the insertion of the component drawer in the chassis is incomplete, the lever may not be pushed into a closed position to insert the hook into the notch, thereby preventing the component drawer from locking into the chassis.

SUMMARY

Provided herein is an apparatus, including: a component drawer, a chassis including an opening configured to removably receive the component drawer therethrough, a cover for the component drawer, and means for locking the component drawer in the chassis during movement of the component drawer into the chassis with the cover in a storage position, and for releasing the component drawer from the chassis when the cover is the non-storage position.

These and other features and aspects of the concepts described herein may be better understood with reference to the following drawings, description, and appended claims.

DRAWINGS

FIGS. 3A-3B illustrate the insertion of a component drawer into a chassis in accordance with an embodiment.

DESCRIPTION

Figure 1:
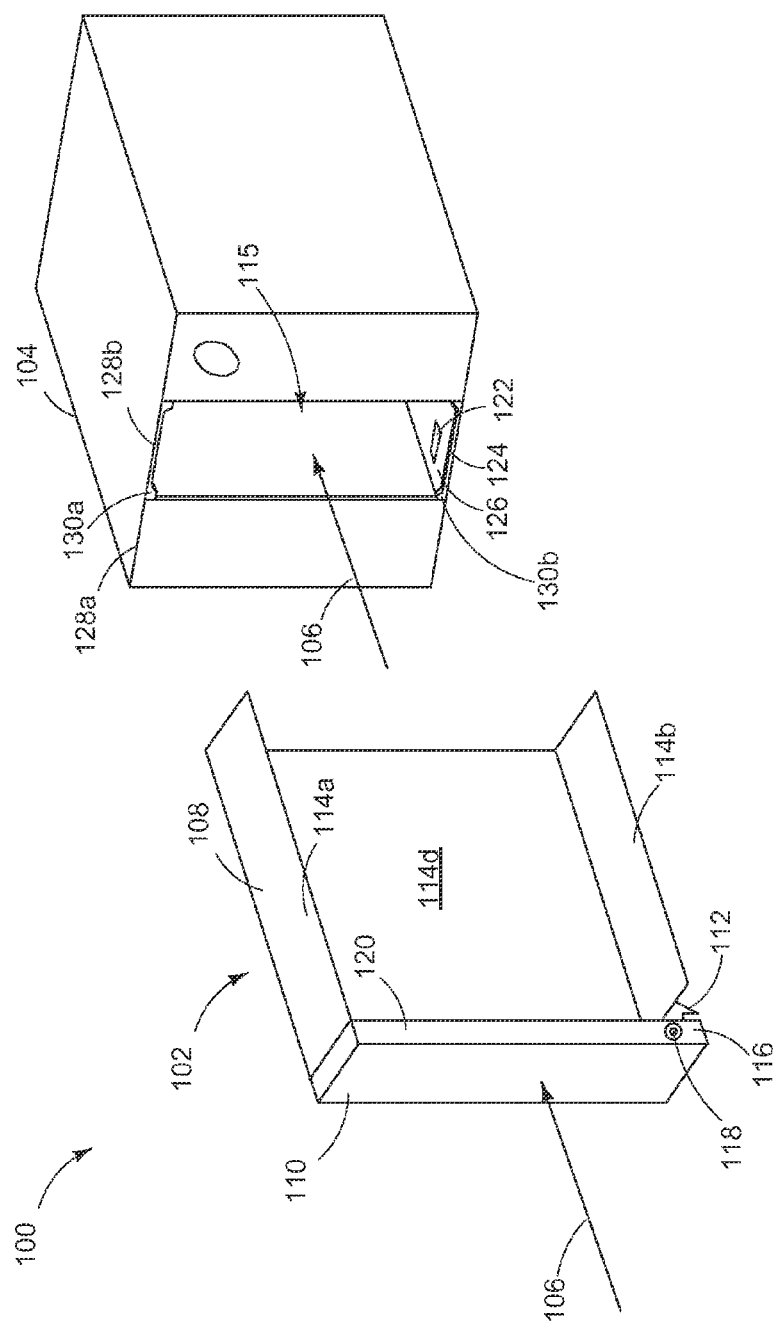
FIG. 1 illustrates an apparatus including a removable component drawer and a chassis in accordance with an embodiment.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Described herein are mechanisms to reliably and easily insert, lock and remove a component drawer from a chassis with minimal effort on the part of the user. For instance, an apparatus described herein includes a means for locking that inserts, "snaps" and locks a component drawer into the chassis. The means for locking may include a latch that automatically fastens and secures the component drawer into the chassis when the component drawer is moved into a locked storage position.

In some embodiments, the apparatus and locking mechanisms described herein allow a user to insert a component drawer into a chassis without manually positioning some of the different parts of the component drawer (e.g., pivoting a cover and/or an engagement member) to insert and lock the component drawer within the chassis. For instance, a user may push on a component drawer to move the component drawer into a chassis, and the latch mechanisms described herein self-engage to lock the component drawer into the chassis. This may be achieved, in some embodiments described herein, with a latch that includes an engagement member with a flexible hook. In some instances, the flexible hook provides a means for deflecting the position of the engagement member from a deflector, and further provides a means to automatically engage with a notch on a chassis during the movement of the component drawer into the chassis. In this way, the latching mechanism described herein independently moves to allow the insertion of the chassis, as well as automatically fastening the component drawer into the chassis when the component drawer is moved into a locked storage position. Thus, a user is freed from the burden of manually positioning a latch (e.g., a hook, a notch) for insertion and locking.

FIG. 1 illustrates an apparatus 100 including a component drawer 102 and a chassis 104 in accordance with an embodiment. In some embodiments, apparatus 100 includes a means for locking, which is described in greater detail below, the component drawer 102 with chassis 104 such that the component drawer 102 may be inserted 106, and snapped and locked with chassis 104. The means for locking may include a latch that automatically fastens and secures the component drawer 102 into the chassis 104 when the component drawer 102 is moved into a locked storage position. The apparatus 100 further includes a means for releasing, which is described in greater detail below, the component drawer 102 from the chassis 104. The means for releasing disengages the latch to unlock the component drawer 102 from the chassis 104 and allows the component drawer 102 to be removed from the chassis 104.

Referring now to component drawer 102, some embodiments include but are not limited to: a component casing 108, a cover 110 and an engagement member 112. The component casing 108 may be configured to hold a peripheral device for a computing system. The component casing 108 includes side walls 114a-114b, a third side wall (e.g., side wall 114c of FIGS. 2A and 2B) coupled with the cover 110, and a base 114d to hold a component. The component casing 108 may hold different types of components such as, for example, a compact disk read-only memory (CD-ROM) drive, a hard disk drive, a floppy disk drive, a graphics card, and other mass storage devices such as a tape drive, compact disk recordable (CD-R) drive and/or a digital video/versatile disk (DVD) drive.

The cover 110, as illustrated in FIG. 1, is positioned in a storage position. The cover 110 is secured to a side wall (not shown) to place the cover in a storage position. In FIG. 1, the storage position of the cover 110 is substantially parallel to the opening 115 of chassis 104. In this way, a user may push on the cover 110 to insert (e.g., arrows 106 illustrate the movement of insertion) and snap lock the component drawer 102 into chassis 104. By positioning the cover 110 in the substantially parallel position as illustrated in FIG. 1 during insertion the component drawer 108 into the chassis 104, the user no longer has to manipulate the cover 110 at certain angles to insert the component drawer 102, which makes inserting the component drawer 108 easier on the user. However, in certain arrangements, the storage position of cover 110 may be at a divergent angle instead of being substantially parallel as illustrated in FIG. 1.

A bottom end 116 of cover 110 is secured to a side wall (not shown) of the component casing 108 by a hinge 118 while an upper end 120 may be engaged and disengaged from a side wall of the component casing 108. In this way, cover 110 may pivot about hinge 118 from a substantially parallel position as illustrated in FIG. 1 to a divergent angle, in some embodiments. For instance, cover 110 may pivot from 0° to all the way 90° about hinge 118.

Further, the cover 110 may include an engagement member 112 of a latch that is configured to self engage with a notch 122 (e.g., the other half of the latch) to lock the component drawer 102 with chassis 104. In FIG. 1, a base portion (not shown) of the engagement member 112 may be coupled to an inner portion (not shown) of the bottom end 116 of cover 110. Then, the remaining portion of the engagement member 112 protrudes from the bottom end 116 to a region beneath an angled region of side wall 114b.

In some embodiments, during the movement of component drawer 102 into chassis 104, the engagement member 112 is configured to deflect from deflectors and automatically fasten to notch 122 to insert and lock the component drawer 102 with chassis 104. For example, during the movement of component drawer 102 into chassis 104, a portion of the engagement member 112 may come into contact with an edge 124 of chassis 104. In such a scenario, the engagement member 112 moves upwards to go over the edge 124 and inward onto an inner surface 126 of chassis 104 as portions of the engagement member 112 come into the contact with the edge 124. In some other instances, the engagement member 112 may deflect into a new position when in contact with other types of deflectors, such as bumps, dents, and/or debris. In this way, the engagement member and the locking mechanism described herein are configured to automatically and independently deflect out of the way of a deflection, without having a user to manually move the engagement member and/or move the cover 110 at different angles to cause the engagement member 112 to move out of the way of a deflection. As such, the locking mechanism described herein makes the operation of insertion easier on a user.

Once the engagement member 112 is inserted into the chassis 104, the engagement member 112 self engages into a locked storage position. That is, the engagement member 112 slides along the surface 126 until the engagement member 112 comes into contact with notch 124. Once the engagement member 112 makes contact with notch 124, the engagement member 112 automatically fastens with notch 124 to lock component drawer 102 with chassis 104. It is appreciated that because the latch (e.g., engagement member 112 and notch 124) self engages upon moving into the locked storage position, the user may ensure that the component drawer is being pushed and inserted into the chassis without being burden to determine whether an engagement member and a notch are aligned to be fastened. In this way, the locking mechanism described herein makes the operation of locking easier on the user.

Referring now to chassis 104, in some embodiments, chassis 104 may be configured to house one or more component drawers, such as component drawer 102. Here, chassis 104 is configured to house two component drawers. In some other embodiments, chassis 104 may be configured to house as few as one component drawer, while in some other embodiments, chassis 104 may be configured to house any number of component drawers, e.g. 3, 4, 5, 6, 7, 8, 9, 10, 11, etc. In some embodiments, chassis 104 may be a hard disk drive bay configured to house one or more hard disk drive drawers. In some instances, chassis 104 may include hard disk drive bays of different form factors, such as 5.25", 3.5", 2.5", and/or 1.8".

Here, chassis 104 includes an opening 115 to allow the insertion and removal of the component drawer 102. The chassis 104 further includes a separate slot (e.g., slot 128a and 128b) for each component drawer that may be housed within chassis 104. The chassis 104 further includes railing 130a and 130b to guide the component drawer 102 during insertion of the component drawer 102 into slot 128b. Further, chassis 104 includes a notch 122 of a latch to engage with engagement member 112 to lock the component drawer 102 into the chassis 104, as described in greater detail below.

Although FIG. 1 illustrates a component drawer 102 being inserted in a vertical position relative to the chassis 104, it is intended to be illustrative and is not intended to limit the concepts described herein. In some embodiments, the component drawer 102 may be inserted into chassis 104 in a horizontal position, a diagonal position or some other position. Further, it is appreciated that the illustration of latch as described herein including one engagement member and one notch is intended to be illustrative and is not intended to limit the scope of the concepts described herein. In some embodiments, more than one engagement member and notch may be used. Further the engagement member and notch described herein may be located in different locations than the ones illustrated. For example, the engagement member 112 may be located anywhere beneath and along side wall 114b and notch 124 may be located in a corresponding location somewhere along the inner surface 126. In some examples, the engagement member 112 may be located near the upper edge 120 of cover 110 and/or near the side wall 114a. As such, notch 124 may be located in a corresponding location on an upper inner surface wall of chassis 104. In some embodiments, the locations of the latch (e.g., engagement member 112 and notch 124) may be any combination of examples and embodiments described herein.

Figure 2A:
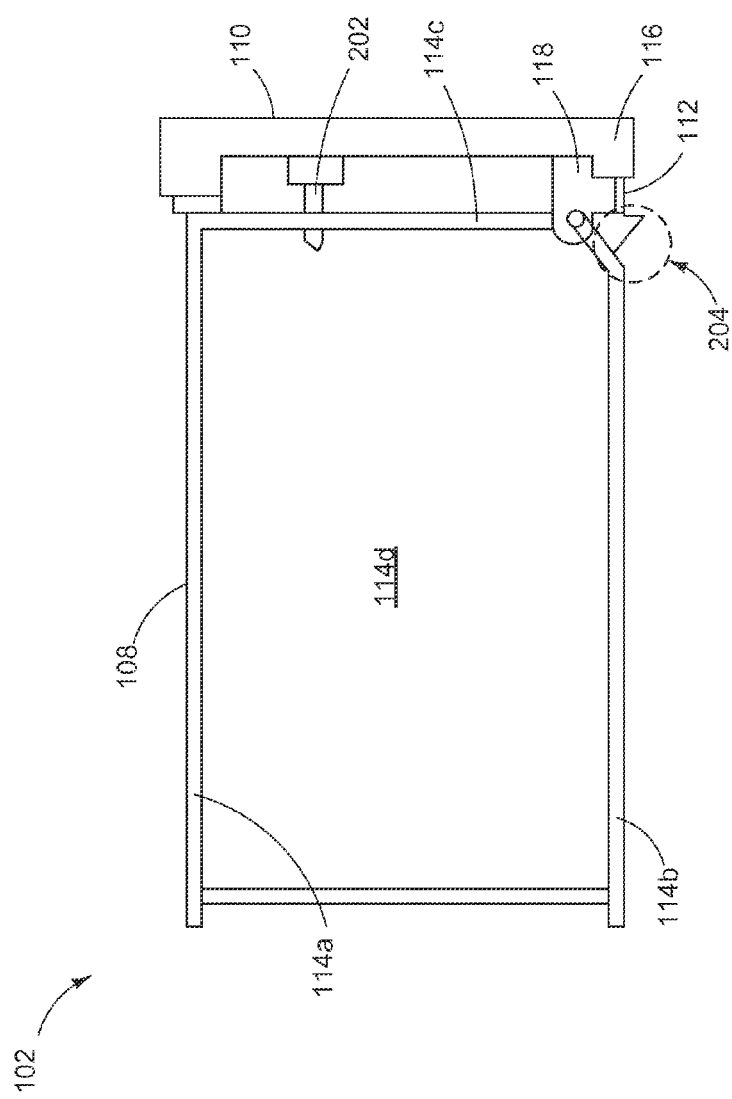
FIGS. 2A-2B are top views of a component drawer including a cover in a storage position and in a non-storage position in accordance with some embodiments.
Figure 2B:
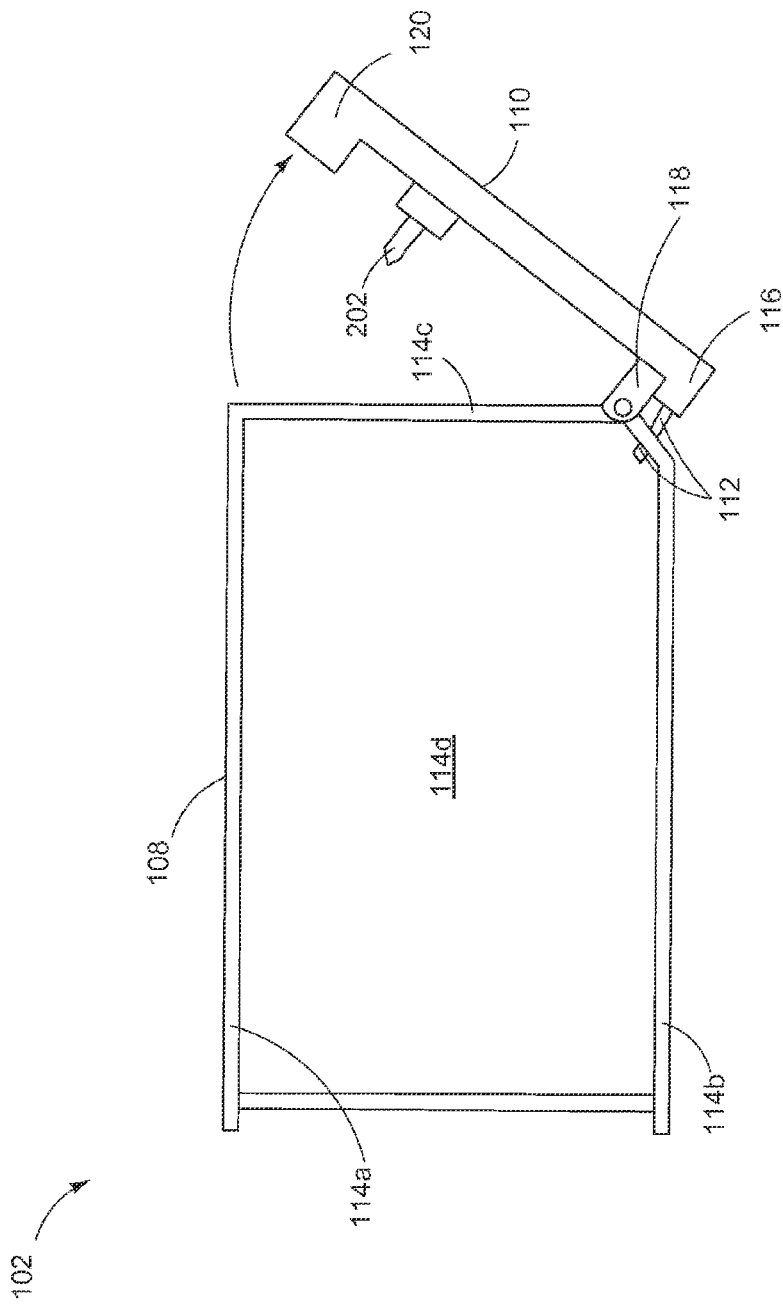

FIGS. 2A-2B are a top view of a component drawer including a cover in a storage position and in a non-storage position in accordance with some embodiments. FIG. 2A shows component drawer 102 in a storage position to insert and lock the component drawer into a chassis, such as chassis 104 of FIG. 1. In the storage position, cover 110 is secured with side wall 114c of component casing 108. The cover 110 includes a protruding member 202 from an inner surface of the cover 110. The protruding member 202 engages with a recess (not shown) of a side wall 114c to secure the cover 110 with component casing 108.

Further in the storage position, engagement member 112 extends from an inner surface (not shown) of a lower end 116 of cover 110, and then extends out. As indicated by circle 204 in FIG. 2A, a flexible hook with a beveled surface extends out from the lower end 116. As described herein, the engagement member 112 can independently deflect into a position to move into a chassis and further automatically engage the component drawer 102 with a chassis, without a user manually positioning the engagement member. As a result, as illustrated in FIG. 2A, in the storage position the cover 110 may be positioned substantially parallel to an opening of a chassis and/or substantially parallel to the sidewall 114c. This allows a user to push on an exterior surface of cover 110 to insert and lock component drawer 102 into a chassis, which eases the operation of insertion on the user.

Referring now to FIG. 2B, a top view of component drawer 102 including cover 110 in a non-storage position is shown in accordance with an embodiment. The component drawer 102 is placed in a non-storage position to unlock the component drawer 102 from a chassis, such as chassis 104 of FIG. 1. Once unlocked, the component drawer 102 may be removed from the chassis.

To unlock the component drawer 102 from a chassis, the cover 110 is changed from the storage position as illustrated to FIG. 2A to a non-storage position. Here, an upper end 120 of the cover 110 is moved outward to a divergent angle relative to an opening of chassis (e.g., opening 114 of chassis 104 of FIG. 1) and/or relative to the sidewall 114c. A lower end 116 of the cover 110 pivots about hinge 118. The movement of cover 110 to a divergent angle as illustrated in FIG. 2B causes the engagement member 112 to disengage from a notch, such as notch 122 of chassis 104 in FIG. 1. Then, the engagement member 112 is pivoted into a recess (not shown) in the angled portion of the side wall 114c. Then, a user may pull on the cover 110 to remove the component drawer 102 from a chassis.

Figure 3B:
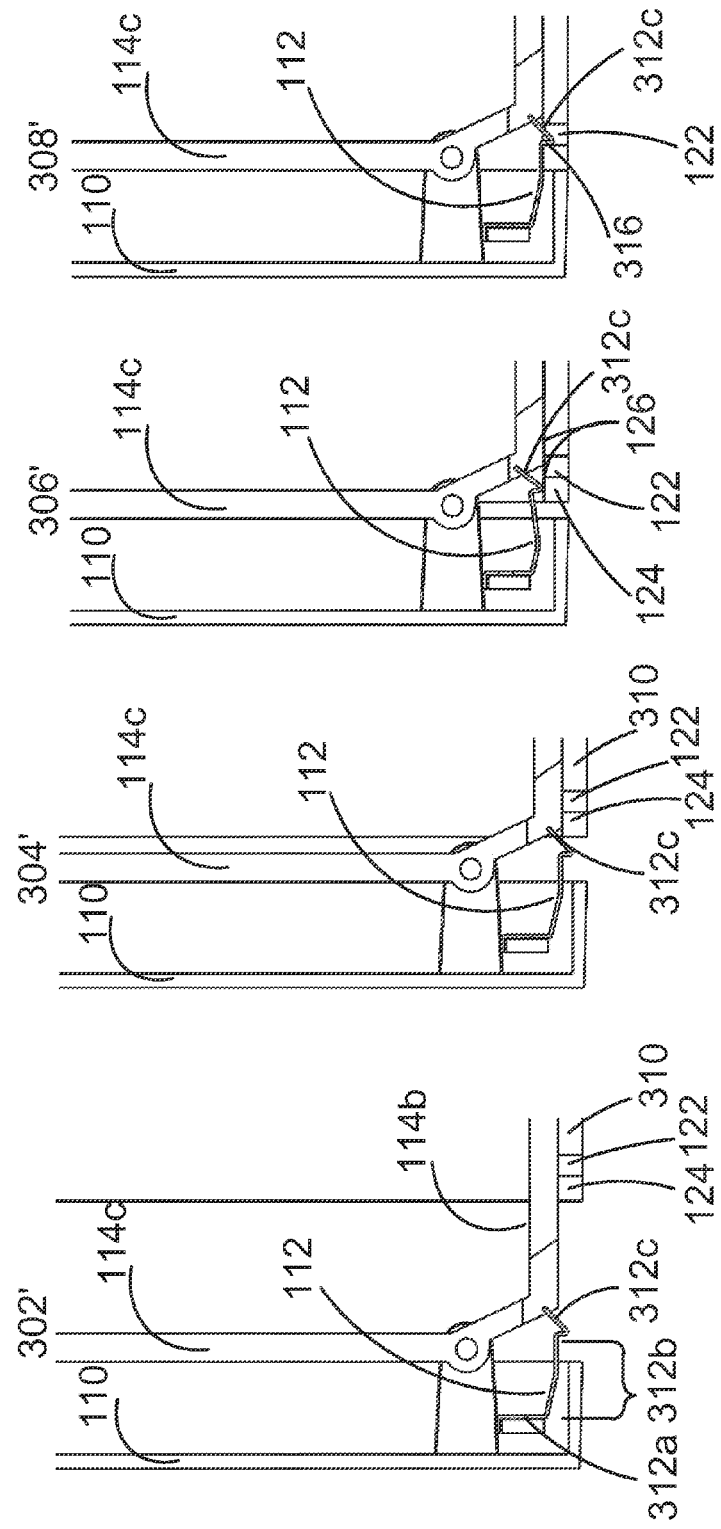

FIGS. 3A-3B illustrate the insertion of a component drawer into a chassis in accordance with an embodiment. Images 302-308 of FIG. 3A illustrate a section side view of a component drawer and a chassis, and further illustrate the step by step functionality of a means for locking a component drawer in a chassis during the movement of the component drawer into the chassis. Images 302'-308' of FIG. 3B illustrate an alternative perspective of images 302-308 of FIG. 3A, respectively.

Image 302 illustrates a portion of apparatus 100 of FIG. 1 in a section side view. Image 302 illustrates cover 110 of apparatus 100 (FIG. 1) secured with side wall 114c of component case 108 (FIG. 1) in a storage position. Image 302 further illustrates the insertion of component drawer 102 (FIG. 1) into the chassis 104 (FIG. 1) in progress. For instance in image 302, side wall 114c slides on the surface of a wall 310 of chassis 104 (FIG. 1) as the component drawer 102 is moved into the chassis 104.

The apparatus 100 in image 302 includes a latch configured to engage between the component drawer 102 and the chassis 104. The latch includes the engagement member 112 and notch 122. A portion of the engagement member 112 is coupled to an inner surface of cover 110 while a portion of the engagement member 112 extends from cover 110. In FIGS. 3A and 3B, the engagement member is a metal spring that includes a base 312a coupled to an end of the cover 110. In some instances, the base 312a may be screwed or bolted into cover 110. The metal spring further includes a body 312b extending from the base 312a, and a flexible hook 312c at the end of the body 312b configured to engage with notch 122 to lock the component drawer 102 in the chassis 104 upon movement into the locked storage position. It is appreciated that FIGS. 3A and 3B are illustrative of the engagement member 112, and are not intended to limit the concepts described herein. In some embodiments, an engagement member may include a base similar to base 312a, a body including a metal spring, and a flexible hook similar to flexible hook 312c.

As the component drawer 102 moves into the chassis 104, a portion of the engagement member 112, such as the flexible hook 312c, may come into contact the edge 124 of chassis 102, as illustrated in image 304 of FIG. 3A and image 304' of FIG. 3B. In such a scenario, the apparatus 100 (FIG. 1) provides a means for bringing the engagement member 112 to a deflected position during the movement of the component drawer into the chassis 104. The means for bringing the engagement member to the deflected position deflects the engagement member 112 relative to the chassis 102 when a portion of the engagement member contacts a deflector on the chassis during the movement of the component drawer into the chassis. In some instances, the means for bringing the engagement member to the deflected position includes the engagement member 112, a deflector, and/or the cover 110, or some combination thereof.

For example, as a push force is exerted on cover 110 to move the component drawer 102 into the chassis 104, tension is formed between a portion of the engagement member 112 (e.g., flexible hook 312c) in contact with the stationary edge 124, as illustrated in image 304 of FIG. 3A and image 304' of FIG. 3B. In order to utilize the push force and the created tension to move the engagement member 112 in a deflected position, the flexible hook 312c of the engagement member 112 includes a beveled surface. As such, the tension between the beveled surface of the flexible hook 312c and edge 124 causes the engagement member 112 to deflect upwards and inwards onto a surface 126 of chassis 102, as illustrated in image 306 of FIG. 3A and image 306' of FIG. 3B. In this way, the combination of the push force on cover 110 and the tension between the bevel surface of the flexible hook 312c provides a means to bring the engagement member 112 to a deflected position.

As the component drawer 102 continues to move into the chassis 104, the engagement member 124 slides on the surface 126 of the chassis 102 until the engagement member is moved into the locked storage position. That is, the engagement member moves from sliding on a surface 126 of the chassis into the notch 122 when the edge of the flexible hook 312c meets the edge of notch 122. The flexible hook 312c engages with notch 122 by moving inwards into the notch 122 to lock the component drawer 102 into the chassis 104, as illustrated in image 308 of FIG. 3A and image 308' of FIG. 3B. In other words, the flexible hook 312c snaps and locks with notch 122. In some instances, when the flexible hook 312c engages with notch 122, a snapping or clicking sound is made indicating that the component drawer 102 is locked into chassis 104.

In order to lock the component drawer 102 into the chassis, the flexible hook 312c includes a flat side 316 that is flushed against a wall of notch 122, as illustrated in image 308 of FIG. 3A and image 308' of FIG. 3B. In this way, the flat side 316 ensures that the component drawer 102 remains engaged and locked within the chassis 102 as long as the cover 110 remains in the locked storage position. However, if cover 110 is changed to a non-storage position as described in FIG. 2B, then the engagement member 112 is disengaged from notch 122.

Figure 4:
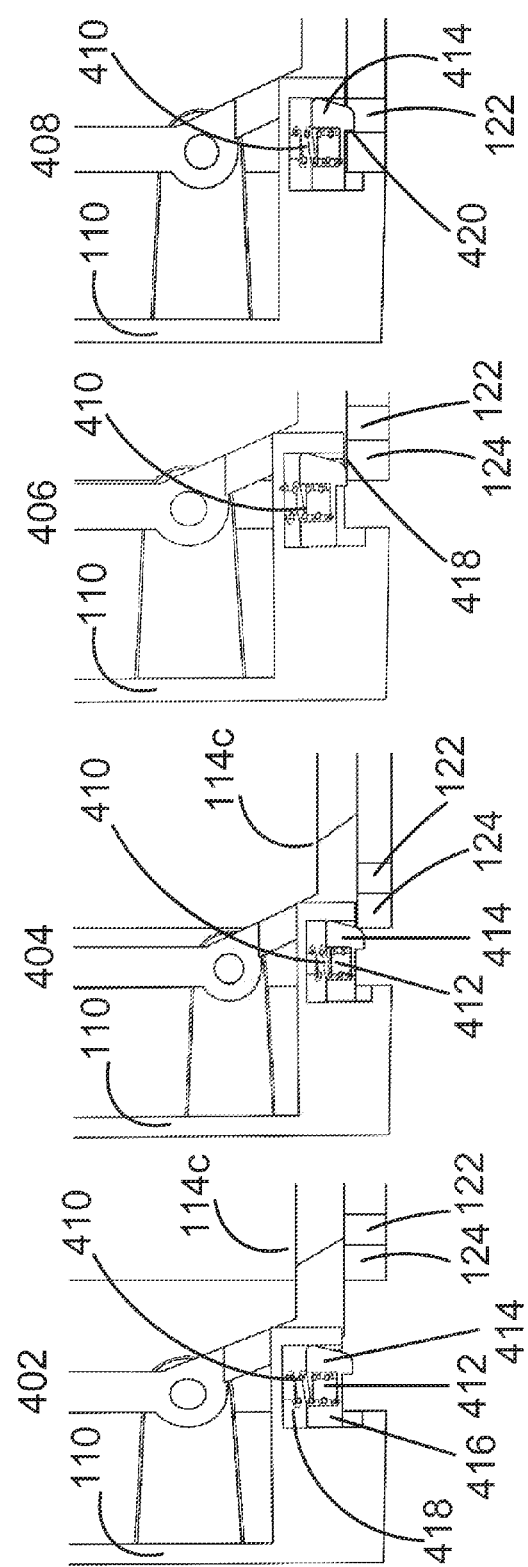
FIG. 4 illustrates the insertion of a component drawer into a chassis in accordance with an embodiment.

FIG. 4 illustrates the insertion of a component drawer into a chassis in accordance with an embodiment. Images 402-408 of FIG. 4 illustrate a section side view of a component drawer and a chassis, and further illustrate the step by step functionality of a means for locking a component drawer in a chassis during the movement of the component drawer into the chassis.

Similar to image 302 of FIG. 3A, image 402 illustrates a portion of apparatus 100 of FIG. 1 in a section side view, except the arrangement and features of the engagement member 410 of FIG. 4 are different from the engagement member 112 of FIG. 3A.

In FIG. 4, the engagement member 410 includes a spring 412, a hook 414, and a base 416. The spring 412 may be, for example, a steel spring, some other metallic spring, and/or some other non-metallic spring. The hook 414 and the base 416 may be made of plastic, steel and/or of a metal. The engagement member 410 is housed in a cut-out region 418 near the lower end of cover 110. Within the cut-out region 418, the spring 412 is coupled to a ceiling of the cut-out region 418 and to a body between hook 414 and the base 416. In such an arrangement, the spring 412 provides a means for bringing the engagement member 410 to a deflected position during the movement of the component drawer 102 (FIG. 1) into the chassis 104 (FIG. 1), which is described in greater detail below. Further, the base 416 is coupled to a side of cut-out region 418. The base 416 may be screwed into the side of the cut-out region 418, in some instances.

As the component drawer 102 moves into the chassis 104, a portion of the engagement member 410, such as the hook 414, may come into contact with the edge 124 of chassis 102, as illustrated in image 404 of FIG. 4. In such a scenario, the apparatus 100 (FIG. 1) provides a means for bringing the engagement member 112 to a deflected position during the movement of the component drawer 102 into the chassis 104. As noted in FIGS. 3A and 3B, the means for bringing the engagement member to the deflected position deflects the engagement member 410 relative to the chassis 102 when a portion of the engagement member 410 contacts a deflector. In some instances, the means for bringing the engagement member to the deflected position includes the engagement member 410, a deflector, and/or the cover 110, or some combination thereof.

As described in FIGS. 3A-3B, as a push force is exerted on cover 110 to move the component drawer 102 into the chassis 104, tension is formed between a portion of the engagement member 410 (e.g., hook 414) in contact with the stationary edge 124, as illustrated in image 404. In order to utilize the push force and the created tension to move the engagement member 410 in a deflected position, the engagement member 410 includes a spring 412 and a hook 414 with a beveled surface. As such, the tension between the beveled surface of the flexible hook 312c and edge 124 causes a portion of the spring 412 that flexes to retract the engagement member 410 upwards, which allows the component drawer 102 to continue to be moved into the chassis 104 along with the engagement member 410. In this way, the combination of the push force on cover 110, the spring 412, and the tension between the bevel surface of the hook 414 and the edge 124 provides a means to bring the engagement member 410 to a deflected position.

As the component drawer 102 continues to move into the chassis 104, the engagement member 410 slides on the surface 126 of the chassis 102 until the engagement member is moved into the locked storage position. That is, when the hook 414 meets the edge of notch 122, the hook 414 engages with the notch 122 by moving inward into the notch 122 to lock the component drawer 102 into the chassis 104, as illustrated in image 408. In other words, the hook 414 snaps and locks with notch 122. Similar to the flexible hook 312c of FIGS. 3A and 3B, hook 414 includes a flat side 420 that ensures that the component drawer 102 remains engaged and locked within the chassis 102 as long as the cover 110 remains in the locked storage position. However, if cover 110 is changed to a non-storage position as described in FIG. 2B, then the engagement member 410 is disengaged from notch 122.

As such, provided herein is an apparatus including: a component drawer, a chassis including an opening configured to removably receive the component drawer therethrough, a cover for the component drawer, and a latch. In some embodiments, the latch is configured to engage between the component drawer and the chassis to lock the component drawer in the chassis during the movement of the component drawer into the chassis with the cover in a storage position, and to release the component drawer from the chassis when the cover is in a non-storage position.

In some embodiments, the latch includes an engagement member, and means for bringing the engagement member to a deflected position during the movement of the component drawer into the chassis. The means for bringing the engagement member to the deflected position deflects the engagement member relative to the chassis when a portion of the engagement member contacts a deflector on the chassis during the movement of the component drawer into the chassis, in some embodiments. In some embodiments, the means for bringing the engagement member to the deflected position includes the engagement member, a deflector on the chassis, the cover, and/or a spring that flexes to deflect the engagement member.

In some embodiments, the latch includes an engagement member configured to self engage to lock the component drawer in the chassis upon moving into the locked storage position. In some embodiments, the latch includes a notch on the chassis, and the engagement member is configured to move from sliding on a surface of the chassis into the notch upon moving into the locked storage position. In some embodiments, the latch includes a notch and an engagement member. In some embodiments, the engagement member includes: a base coupled to an end of the cover, a body extending from the base, and a flexible hook at the end of the body configured to engage with the notch to lock the component drawer in the chassis upon movement into the locked storage position. In some embodiments, the cover is substantially parallel to the opening when in the storage position, and the cover is at a divergent angle relative to the opening when in the non-storage position.

Also provided herein is an apparatus including: a component drawer, a chassis including an opening configured to removably receive the component drawer therethrough, a cover for the component drawer, and means for locking the component drawer in the chassis during movement of the component drawer into the chassis with the cover in a storage position; and for releasing the component drawer from the chassis when the cover is the non-storage position.

In some embodiments, the means for locking and for releasing includes a latch including an engagement member coupled to an end of the cover and a notch on the chassis. In some embodiments, the means for locking is configured to self engage to lock the component drawer in the chassis upon moving into the locked storage position.

In some embodiments, the means for locking includes an engagement member and a notch on the chassis, and the means for locking is configured to move the engagement member from the surface, e of the chassis into the notch upon moving into the locked storage position. In some embodiments, the means for locking includes an engagement member and a means for bringing the engagement member to a deflected position during the movement of the component drawer into the chassis. In some embodiments, the means for bringing the engagement member to the deflected position deflects the engagement member relative to the chassis when a portion of the engagement member contacts a deflector on the chassis during the movement of the component drawer into the chassis.

Further, provided herein is a method including: locking a removable component drawer in a chassis during the movement of the component drawer into the chassis with a cover of the component drawer in a storage position, and releasing the removable component drawer from the chassis by moving the component drawer cover to a non-storage position.

In some embodiments, the method further includes deflecting an engagement member relative to the chassis when a portion of the engagement member contacts a deflector on the chassis during the movement of the component drawer into the chassis. The method further includes engaging an engagement member into a notch on the chassis when moving into the locked storage position, in some embodiments. In some embodiments, the method further includes moving the engagement member from sliding on a surface of the chassis into the notch to engage the engagement member into the locked storage position.

In some embodiments, the cover is substantially parallel to an opening when in the storage position, and the cover is at a divergent angle relative to the opening when in the non-storage position. In some embodiments, an engagement member is coupled to the cover. The engagement member includes: a base coupled to an end of the cover, a body extending from the base, and a flexible hook at the end of the body configured to engage with a notch of the chassis to lock the component drawer in the chassis upon movement into the locked storage position.

While the embodiments have been described and/or illustrated by means of particular examples, and while these embodiments and/or examples have been described in considerable detail, it is not the intention of the applicant(s) to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein, which scope is limited only by the following claims when appropriately construed.

What is claimed is:

1. An apparatus comprising:
   a component drawer;
   a chassis including an opening configured to removably receive the component drawer therethrough;
   a cover for the component drawer, wherein the component drawer includes a protruding member configured to secure the cover to a casing of the component drawer; and
   a latch configured:
      to engage between the component drawer and the chassis to lock the component drawer in the chassis during the movement of the component drawer into the chassis with the cover in a storage position, wherein a flexible hook positioned on the component drawer is configured to flex and move in response to the component drawer moving relative to the chassis, and wherein the flexible hook engages a notch on the chassis to secure the component drawer in the chassis; and
      to release the component drawer from the chassis when the cover is in a non-storage position, wherein the flexible hook disengages from the notch on the chassis to release the component drawer from the chassis.

2. The apparatus of claim 1, wherein the latch includes:
   an engagement member; and
   means for bringing the engagement member to a deflected position during the movement of the component drawer into the chassis.

3. The apparatus of claim 2, wherein the means for bringing the engagement member to the deflected position deflects the engagement member relative to the chassis when a portion of the engagement member contacts a deflector on the chassis during the movement of the component drawer into the chassis.

4. The apparatus of claim 2, wherein the means for bringing the engagement member to the deflected position includes the engagement member, a deflector on the chassis, the cover, or a spring that flexes to deflect the engagement member.

5. The apparatus of claim 1, wherein the latch includes an engagement member configured to self engage to lock the component drawer in the chassis upon moving into the locked storage position.

6. The apparatus of claim 5,
   wherein the engagement member is configured to move from sliding on a surface of the chassis into the notch upon moving into the locked storage position.

7. The apparatus of claim 1,
   wherein the latch includes the notch and an engagement member; and
   wherein the engagement member includes:
      a base coupled to an end of the cover,
      a body extending from the base, and
      the flexible hook at the end of the body configured to engage with the notch to lock the component drawer in the chassis upon movement into the locked storage position.

8. The apparatus of claim 1,
   wherein the cover is substantially parallel to the opening when in the storage position; and
   wherein the cover is at a divergent angle relative to the opening when in the non-storage position.

9. An apparatus, comprising:
a component drawer;
a chassis including an opening configured to removably receive the component drawer therethrough;
a cover for the component drawer, wherein the component drawer includes a protruding member configured to secure the cover to a casing of the component drawer; and
means for locking the component drawer in the chassis during movement of the component drawer into the chassis with the cover in a storage position, wherein a flexible hook positioned on the component drawer is configured to flex and move in response to the component drawer moving relative to the chassis, and wherein the flexible hook engages a notch on the chassis to secure the component drawer in the chassis; and for releasing the component drawer from the chassis when the cover is the non-storage position, wherein the flexible hook disengages from the notch on the chassis to release the component drawer from the chassis.

10. The apparatus of claim 9, wherein means for locking and for releasing includes a latch including an engagement member coupled to an end of the cover and the notch on the chassis.

11. The apparatus of claim 9, wherein the means for locking is configured to self engage to lock the component drawer in the chassis upon moving into the locked storage position.

12. The apparatus of claim 11,
wherein the means for locking includes an engagement member and the notch on the chassis; and
wherein the means for locking is configured to move the engagement member from the surface of the chassis into the notch upon moving into the locked storage position.

13. The apparatus of claim 9, wherein the means for locking includes an engagement member and a means for bringing the engagement member to a deflected position during the movement of the component drawer into the chassis.

14. The apparatus of claim 13, wherein the means for bringing the engagement member to the deflected position deflects the engagement member relative to the chassis when a portion of the engagement member contacts a deflector on the chassis during the movement of the component drawer into the chassis.

* * * * *